United States Patent [19]

Sakamoto et al.

[11] 4,189,678
[45] Feb. 19, 1980

[54] COMBINATION VHF-UHF TUNER FOR USE IN A TELEVISION RECEIVER

[75] Inventors: Shuji Sakamoto, Daito; Shuichi Wada, Nara, both of Japan

[73] Assignee: Sanyo Electric Co., Ltd., Osaka, Japan

[21] Appl. No.: 934,523

[22] Filed: Aug. 17, 1978

[30] Foreign Application Priority Data

Aug. 18, 1977 [JP] Japan .................. 52/111485[U]

[51] Int. Cl.² ........................................... H04B 1/16
[52] U.S. Cl. ........................... 325/459; 325/462; 325/490; 334/15
[58] Field of Search ............... 325/458, 459, 462, 463, 325/490, 452, 489; 358/191; 334/15, 18

[56] References Cited

U.S. PATENT DOCUMENTS

| 3,723,882 | 3/1973 | Carlson | 325/458 |
| 3,727,140 | 4/1973 | Rodrigalvarz Nieto et al. | 325/458 |
| 3,903,487 | 9/1975 | Maier | 325/458 |

FOREIGN PATENT DOCUMENTS

1591364  8/1970  Fed. Rep. of Germany .......... 325/459
2134351  7/1971  Fed. Rep. of Germany .......... 325/458

Primary Examiner—Robert L. Griffin
Assistant Examiner—Alexander Gerasimow
Attorney, Agent, or Firm—Armstrong, Nikaido, Marmelstein & Kubovcik

[57] ABSTRACT

A combination VHF-UHF tuner includes a VHF tuner and a UHF tuner in which the VHF tuner has at least three tuning networks connected in a stage preceding a mixer and each constituted by first and second coils and a variable capacitance diode. The first coil in each of the tuning network is coupled to a switching diode for shortcircuiting the first coil for establishing a network operable to a high band VHF signal and for opening the first coil connected to the second coil for establishing a tuning network operable to a low band VHF signal. A band selecting circuit is provided for controlling the three tuning networks in such a manner that the three tuning networks are all operable to the high or low band VHF signal when the VHF channel is tuned in and that at least one of the three tuning networks is operable to the high band VHF signal while the remaining is operable to the low band VHF signal when the UHF channel is tuned in.

2 Claims, 3 Drawing Figures

COMBINATION VHF-UHF TUNER FOR USE IN A TELEVISION RECEIVER

BACKGROUND OF THE INVENTION

The present invention relates to a television receiver, and more particularly, to a combination VHF-UHF tuner in which a variable capacitance element is so arranged as to serve as a tuning element for electrically selecting a desired channel while a mixer employed in a VHF tuner serves as an intermediate frequency amplifier when a UHF channel is tuned in.

The abbreviation VHF and UHF used hereinabove and hereinbelow stands for very-high frequency and ultra-high frequency, respectively.

Conventionally, there have been proposed various types of the combination VHF-UHF tuner, one example is shown in FIG. 1. Referring to FIG. 1, there is shown a block diagram of the conventional tuner which includes a VHF tuner 1 having an input tuning circuit 2, a radio frequency amplifier, a primary interstage tuning circuit 3, a secondary interstage tuning circuit 4, a mixer 5, which are connected in series between a VHF input A and a tuner output B, and a local oscillator 6 connected to a junction Ja between the secondary interstage tuning circuit 4 and the mixer 5. The conventional tuner shown in FIG. 1 further includes a UHF tuner 7 connected between a UHF input C and a switch 8 which is in turn connected to the junction Ja.

According to the above described conventional tuner, particularly the one which is located at place where the VHF signal is strong, the input tuning circuit 2 and primary and secondary interstage tuning circuits 3 and 4 are normally set in a tuned condition with VHF high band signal, even when the UHF channel is tuned in, so that the VHF broadcasting signals carried in high channels are apt to be transmitted to the mixer 5. Therefore, in the case where the television receiver is set to receive UHF broadcasting signal, the VHF broadcasting signals carried in high channels may interfere with the UHF broadcasting signal.

Such interference may take place when the input tuning circuit 2 and primary and secondary interstage tuning circuits 3 and 4 are normally set in a tuned condition with VHF low band signals. In this case, the UHF broadcasting signal may be interfered by the VHF broadcasting signal of low channels.

Accordingly, a primary object of the present invention is to provide a tuning device which prevents the VHF signals from being transmitted to the mixer when the UHF signal is tuned in.

Another object of the present invention is to provide a tuning device of the above described type which is simple in construction and can readily be manufactured at low cost.

In accordance with a preferred embodiment of the invention, a combination VHF-UHF tuner comprises: a UHF tuner; a VHF tuner having an input tuning circuit, a primary interstage tuning circuit, a secondary interstage tuning circuit and a mixer connected in series between a VHF input and a tuner output and local oscillator; means connected to the UHF tuner for operating the same when UHF channel is tuned in; and means connected to the VHF tuner for making the input tuning circuit, primary interstage tuning circuit and secondary interstage tuning circuit operative to high band VHF signal when high channel VHF signal is tuned in, for making the input tuning circuit, primary interstage tuning circuit and secondary interstage tuning circuit operative to low band VHF signal when low channel VHF signal is tuned in, and for making at least one of the input tuning circuit, primary interstage tuning circuit and secondary interstage tuning circuit operative to high band VHF signal and the remaining operative to low band VHF signal when UHF channel is tuned in.

BRIEF DESCRIPTION OF THE DRAWINGS

These and other objects and features of the present invention will become apparent from the following description taken in conjunction with a preferred embodiment thereof with reference to the accompanying drawings, in which.

DETAILED DESCRIPTION OF THE INVENTION

Figure 1:
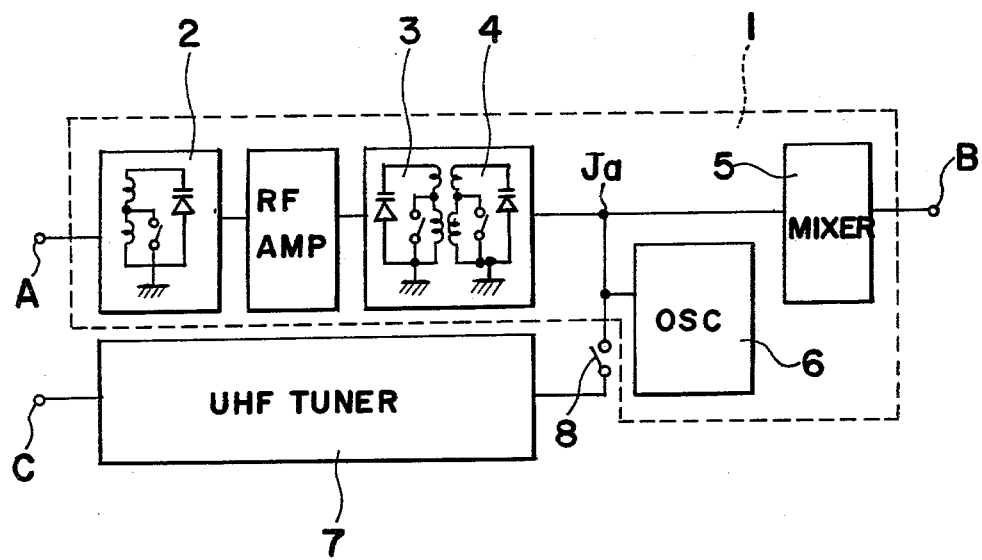
FIG. 1 which have already been referred to in the foregoing description is a block diagram of a combination VHF-UHF tuner of a prior art.

Before the description of the present invention proceeds, it is to be noted that like parts are designated by like reference numerals throughout the accompanying drawings.

Figure 2:
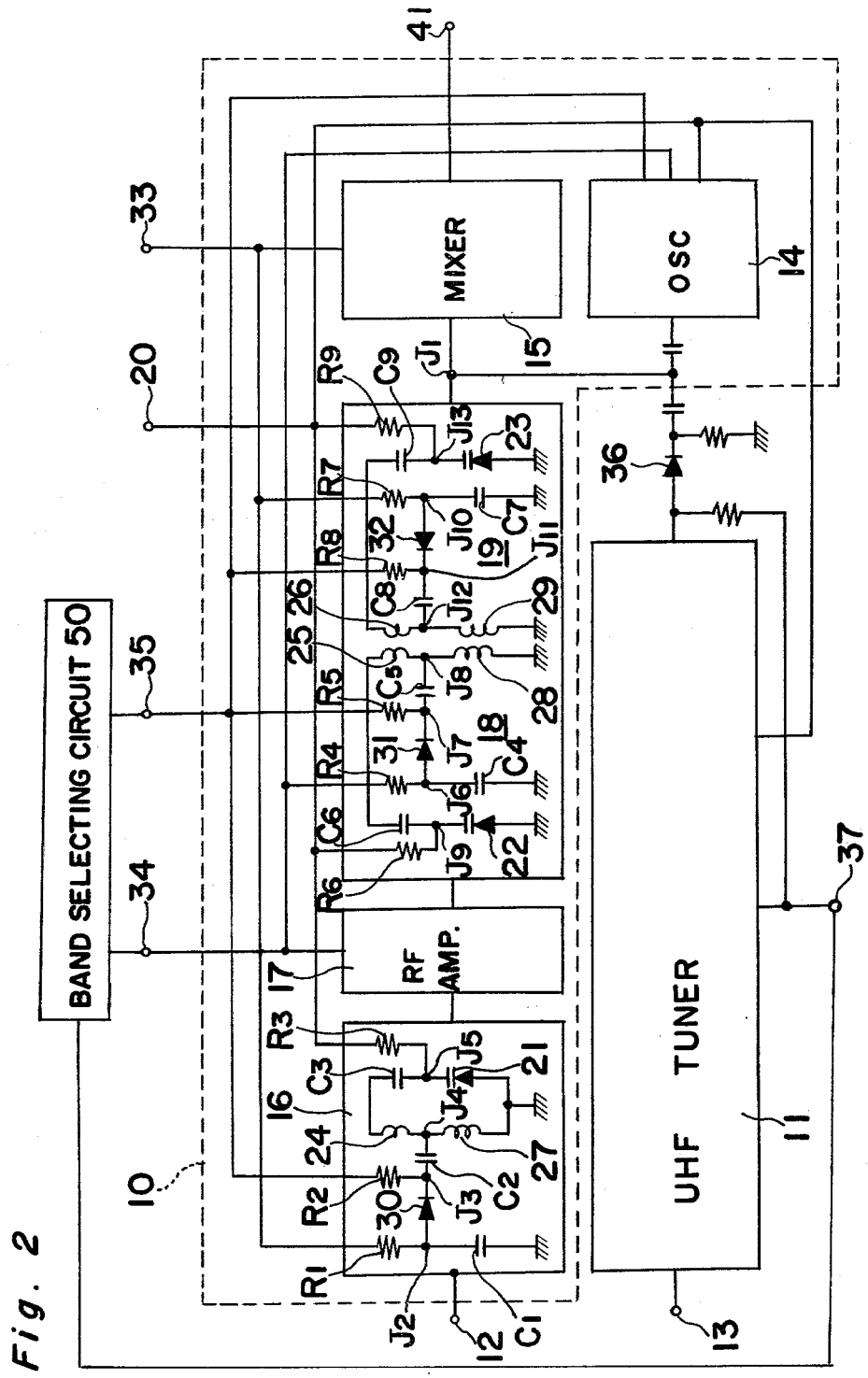
FIG. 2 is a block diagram partly showing a detailed network of a combination VHF-UHF tuner of the present invention.

Referring to FIG. 2, there is shown a combination VHF-UHF tuner of the present invention, in which a reference numeral 10 designates a VHF tuner while a reference numeral 11 designates a UHF tuner. The VHF tuner 10 includes an input tuning circuit 16, a radio frequency amplifier 17, a primary interstage tuning circuit 18, a secondary interstage tuning circuit 19 and a mixer 15 which are connected in series between a VHF input 12 and a tuner output 41. The VHF tuner 10 further includes a local oscillator 14 connected to a junction $J_1$ between the secondary interstage tuning circuit 19 and the mixer 15.

Before describing each of the tuning circuits 16, 18 and 19, it is to be noted that FIG. 2 illustrates only circuit components necessary to describe the present invention, and that these tuning circuits 16, 18 and 19 operate, when VHF channel is tuned in, in a known manner.

The input tuning circuit 16 comprises a resistor $R_1$ and a capacitor $C_1$ connected in series between a power supplying terminal 33 for the mixer 15 and the ground. A junction $J_2$ between the resistor $R_1$ and the capacitor $C_1$ is connected to an anode of a switching diode 30, whereas the cathode of the switching diode 30 is connected to a capacitor $C_2$ through a junction $J_3$. The junction $J_3$ is connected through a resistor $R_2$ to a terminal 35 which receives a band selecting signal from a band selecting circuit 50 as will be described in detail later with reference to FIG. 3. The input tuning circuit 16 further comprises an LC circuit including coils 24 and 27, capacitor $C_3$ and a variable capacitance diode 21. A junction $J_4$ between the coils 24 and 27 is connected to the capacitor $C_2$ whereas a junction $J_5$ between the capacitor $C_3$ and cathode of the variable capacitance diode 21 is connected through a resistor $R_3$ to a tuning voltage supplying terminal 20. The anode side of the variable capacitance diode 21 and the coil 27 are grounded.

The radio frequency amplifier 17 is constituted by any known amplifier so designed as to amplify high frequency signal. Therefore, a detailed description thereof is omitted for the sake of brevity.

The primary and secondary interstage tuning circuits 18 and 19 have a similar network as the network of the input tuning circuit 16. The primary interstage tuning circuit 18 comprises a resistor $R_4$ and a capacitor $C_4$ connected in series between the ground and a power supplying terminal 34 which is provided for supply power to the radio frequency amplifier 17 and to the local oscillator 14. The terminal 24 receives power from the band selecting circuit 50. A junction $J_6$ between the resistor $R_4$ and the capacitor $C_4$ is connected to an anode of a switching diode 3, whereas the cathode of the switching diode 31 is connected to a capacitor $C_5$ through a junction $J_7$. The junction $J_7$ is connected through a resistor $R_5$ to a terminal 35. The primary interstage tuning circuit 18 further comprises an LC circuit including coils 25 and 28, capacitor $C_6$ and a variable capacitance diode 22. A junction $J_8$ between the coils 25 and 28 is connected to the capacitor $C_5$ whereas a junction $J_9$ between the capacitor $C_6$ and cathode of the variable capacitance diode 22 is connected through a resistor $R_6$ to the tuning voltage supplying terminal 20. The anode side of the variable capacitance diode 22 and the coil 28 are grounded.

The secondary interstage tuning circuit 19 comprises a resistor $R_7$ and a capacitor $C_7$ connected in series between the ground and the power supplying terminal 33 provided for supplying power to the mixer 25. A junction $J_{10}$ between the resistor $R_7$ and the capacitor $C_7$ is connected to an anode of a switching diode 32, whereas the cathode of the switching diode 32 is connected to a capacitor $C_8$ through a junction $J_{11}$. The junction $J_{11}$ is connected through a resistor $R_8$ to a terminal 35. The secondary interstage tuning circuit 19 further comprises an LC circuit including coils 26 and 29, capacitor $C_9$ and a variable capacitance diode 23. A junction $J_{12}$ between the coils 26 and 29 is connected to the capacitor $C_8$ whereas a junction $J_{13}$ between the capacitor $C_9$ and the cathode of the variable capacitance diode 23 is connected through a resistor $R_9$ to the tuning voltage supplying terminal 20. The anode side of the variable capacitance diode 23 and the coil 29 are grounded.

The variable capacitance diodes 21, 22 and 23 are set to produce a predetermined capacitance by a DC voltage applied from the terminal 20.

Still referring to FIG. 2, the UHF tuner 11 of any known type is actuated when high voltage signal is applied to a terminal 37 from the band selecting circuit 50. Such high voltage applied to the terminal 37 also actuates a switching diode 36 connected between the output of the UHF tuner and the junction $J_1$. Therefore, when the terminal 37 receives high voltage, the UHF tuner 11 is actuated and, at the same time, the switching diode 36 electrically connects the UHF tuner 11 to the mixer 15 for supplying intermediate frequency signal produced from the UHF tuner 11 to the mixer 15. On the other hand, when the terminal 37 receives a low signal, the UHF tuner 11 is brought into inoperative position and, at the same time, the switching diode 36 electrically interrupts the UHF tuner from the mixer 15. The mixer 15 is always provided with an actuating voltage (+B3) from the terminal 33 when and so long as the television receiver is turned on.

Figure 3:
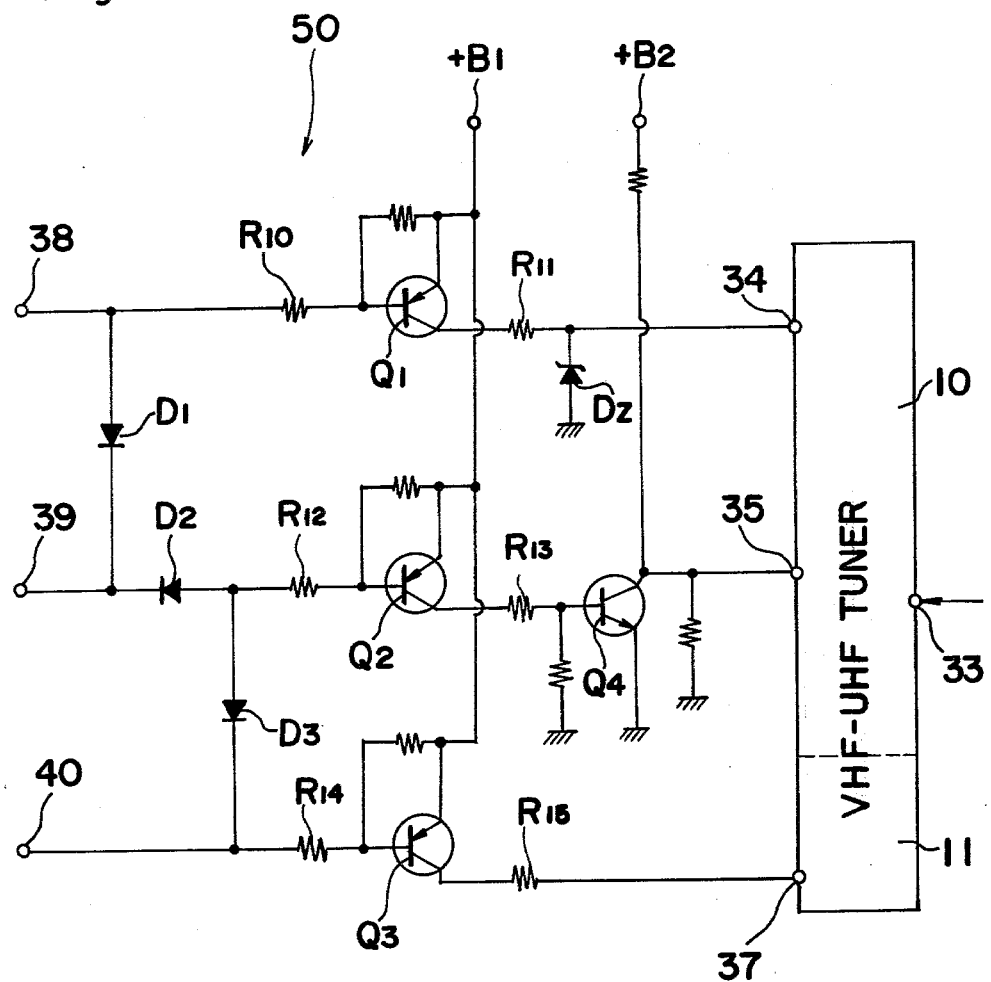
FIG. 3 is a circuit diagram of a band selecting circuit.

Referring to FIG. 3, the band selecting circuit 50 includes three transistors $Q_1$, $Q_2$ and $Q_3$ the emitters of these transistors $Q_1$, $Q_2$ and $Q_3$ being connected to each other and in turn to a source of voltage (+B1). The base of the transistor $Q_1$ is connected through a resistor $R_{10}$ to a terminal 38 which receives a negative VHF low band setting signal from an electric channel selecting apparatus (not shown) of any known type. The collector of the transistor $Q_1$ is connected through a resistor $R_{11}$ to the terminal 34 of the VHF-UHF tuner described above and also to the ground through a zener diode Dz. The base of the transistor $Q_2$ is connected through a resistor $R_{12}$ and diode $D_2$ to a terminal 39. The diode $D_2$ is provided for directing electric current to flow towards the terminal 39, when the terminal 39 receives negative VHF high band setting signal from the electric channel selecting apparatus. A diode $D_1$ is connected between the terminals 38 and 39, so that the negative VHF high band setting signal applied to the terminal 39 is directed to the base of the transistor $Q_1$ and also to the base of the transistor $Q_2$. The collector of the transistor $Q_2$ is connected through a resistor $R_{13}$ to a transistor $Q_4$ which has the collector connected to a source of voltage (+B2) and the emitter connected to the ground. The collector of the transistor $Q_4$ is also connected to a terminal 35 of the VHF-UHF tuner. The base of the transistor $Q_3$ is connected through a resistor $R_{14}$ to a terminal 40 which receives a negative UHF setting signal from the electric channel selecting apparatus. The collector of the transistor $Q_3$ is connected to the terminals 37 through a resistor $R_{15}$. A diode $D_3$ is connected between the terminal 40 and the anode side of the diode $D_2$, so that the negative UHF setting signal applied to the terminal 40 is directed to the base of the transistor $Q_2$. An operation of the band selecting circuit 50 is described hereinbelow with reference to FIGS. 2 and 3.

When the electric channel selecting apparatus (not shown) as a whole including the band selecting circuit 50 provides the negative VHF low band setting signal to the terminal 38, the transistor $Q_1$ conducts to provide a predetermined voltage (+15V) determined by the zener diode Dz to the terminals 34 for actuating the radio frequency amplifier 17 and local oscillator 14. Since other terminals 39 and 40 are not provided with any negative setting signals, the remaining transistors $Q_2$, $Q_3$ and $Q_4$ are held in a non-conductive state. Therefore, the terminal 35 receives a predetermined positive voltage (+30V) from the voltage source while the terminal 37 is maintained at zero volt. Under the condition described above, the switching diodes 30, 31 and 32, shown in FIG. 2, are impressed on the cathode sides thereof with positive voltage +30V and on the anode sides thereof with positive voltage +15V. Therefore, the diodes 30, 31 and 32 are all reversely biased to interrupt the electrical connection between the anode and cathode sides of the respective switching diodes 30, 31 and 32. As a consequence, the coils 27, 28 and 29 are in association with the coils 24, 25 and 26, respectively, to establish tuning circuits 16, 18 and 19 which are operative to the low band VHF signals.

When the electric channel selecting apparatus (not shown) provides the negative VHF high band setting signal to the terminal 39, the transistor $Q_2$ conducts to provide biasing voltage to the transistor $Q_4$. Therefore, the transistor $Q_4$ conducts to ground the terminal 35. At the same time, the negative VHF high band setting signal applied to the terminal 39 is fed to the transistor $Q_1$ through a diode $D_1$, so that the terminal 34 is applied with the predetermined voltage (+15V) in a similar manner as described above. The terminal 37 is maintained at zero volt since there is no signal applied to the terminal 40. Under the condition described above, the switching diodes 30, 31 and 32, shown in FIG. 2, are impressed on the cathode sides thereof with zero volt from the terminal 35 and on the anode sides thereof with positive voltage +15V from the terminal 34 and 33. Therefore, the switching diodes 30, 31 and 32 are all forward biased to conduct the same. As a consequence, the junctions $J_4$, $J_8$ and $J_{10}$ are grounded in terms of high frequency region, through the diodes 30, 31 and 32, respectively, to substantially shortcircuit the coils 27, 28 and 29. Accordingly, thus established tuning circuits 16, 18 and 19 are operative to the high band VHF signals.

On the contrary, when the UHF channel is tuned in, the negative UHF setting signal is applied to the terminal 40 for conducting the transistor $Q_3$ on and, in turn, providing a predetermined voltage (+15 V) to the terminal 37. At the same time, the negative UHF setting signal applied to the terminal 40 is also fed through the diode $D_3$ to the transistor $Q_2$ for turning on the transistors $Q_2$ and $Q_4$. Thus, the terminal 35 is grounded. The terminal 34 is maintained at zero voltage since there is no signal applied to the transistor $Q_1$. Under the condition described above, the signal applied to the terminal 37 actuates the UHF tuner 11 and, at the same time, conducts the switching diode 36 to transmit the output signal from the UHF tuner 11 to the mixer 15. In the mixer 15, the intermediate frequency signal of the UHF channel is amplified to produce an output signal of UHF channel from the output terminal 41. When and so long as the UHF channel is tuned in in the manner described above, the signal of VHF channel is interrupted in the VHF tuner as in the manner described hereinbelow.

Since the switching diodes 30 and 32 are provided at their anode sides with positive voltage (+15V) from the terminal 33 and at their cathode sides with zero voltage from the terminal 35, the switching diodes 30 and 32 are turned on to make the tuning circuits 16 and 19 operative to the high band VHF signals. On the contrary, the switching diode 31 is provided at its anode side with zero voltage from the terminal 34 and at its cathode side with zero voltage from the terminal 35, so that the switching diode 31 is maintained non-conductive to make the tuning circuit 18 operative to the low band VHF signal. Accordingly, when the UHF channel is tuned in, the irregularity in the VHF tuner 10 that the tuning circuit 16 and 19 are operative to the high band VHF signals while the tuning circuit 18 is operative to the low band VHF signal prevents any of the VHF signal from being transmitted through the VHF tuner 10. For example, the high band VHF signal applied to the input of the VHF tuner 10 may be transmitted through the input tuning circuit 16, however, will not be transmitted through the primary interstage tuning circuit 18, since the circuit 18 is operative only to the low band VHF signal. Therefore, the UHF signal transmitted through the mixer 15 will not be interfered by any VHF signal.

It is to be noted that, when the UHF channel is tuned in, the irregularity in the VHF tuner 10 may have other combination than those described above and yet having the same effect as to prevent any of the VHF signal from being transmitted through the VHF tuner 10. For example, when the UHF channel is tuned in, one of the three tuning circuits 16, 18 and 19 may be arranged to be operative to the low band VHF signal while other two tuning circuits may be arranged to be operative to the high band VHF signal.

As it has been described fully in the foregoing description, the combination VHF-UHF tuner of the present invention produces VHF or UHF signal which is not interferenced by UHF or VHF signal, respectively, since when the UHF signal is tuned in, one of the three tuning circuits is tuned as operative to the low band VHF signal or high band VHF signal while other two tuning circuits are tuned as operative to the high band VHF signal or low band VHF signal.

Furthermore, the combination VHF-UHF tuner of the present invention employing the variable capacitance diode as an element constituting the tuning circuit and employing the mixer of the VHF tuner, when UHF channel is tuned in, as the intermediate frequency amplifier is applicable to a television receiver particularly positioned in a place where the VHF broad casting signal is strong.

Although the present invention has been fully described by way of examples with reference to the accompanying drawings, it is to be noted that various changes and modifications are apparent to those skilled in the art. Such changes and modifications are, unless they depart from the true scope of the present invention, to be understood as included therein.

What is claimed is:

1. A combination VHF-UHF tuner comprising, in combination:
    a UHF tuner;
    a VHF tuner having an input tuning circuit, a primary interstage tuning circuit, a secondary interstage tuning circuit and a mixer connected in series between a VHF input and a tuner output;
    means connected to the UHF tuner for operating the same when UHF channel is tuned in; and
    means connected to the VHF tuner for making the input tuning circuit, primary interstage tuning circuit and secondary interstage tuning circuit operative to high band VHF signal when high channel VHF signal is tuned in, for making the input tuning circuit, primary interstage tuning circuit and secondary interstage tuning circuit operative to low band VHF signal when low channel VHF signal is tuned in, and for making at least one of the input tuning circuit, primary interstage tuning circuit and secondary interstage tuning circuit operative to high band VHF signal and the remaining operative to low band VHF signal when UHF channel is tuned in.

2. A combination VHF-UHF tuner as claimed in claim 1, wherein each of the input tuning circuit, primary interstage tuning circuit and secondary interstage tuning circuit includes a tuning network constituted by a variable capacitance diode and first and second inductance coils, said second inductance coil coupled with a switching diode for short-circuiting the second inductance coil for making the tuning network operative to the high band VHF signal.

* * * * *